United States Patent
Gorer et al.

(10) Patent No.: US 7,977,152 B2
(45) Date of Patent: Jul. 12, 2011

(54) NON-VOLATILE RESISTIVE-SWITCHING MEMORIES FORMED USING ANODIZATION

(75) Inventors: Alexander Gorer, Los Gatos, CA (US); Prashant Phatak, San Jose, CA (US); Tony Chiang, Campbell, CA (US); Igor Ivanov, Danville, CA (US)

(73) Assignee: Intermolecular, Inc., San Jose, CA (US)

( * ) Notice: Subject to any disclaimer, the term of this patent is extended or adjusted under 35 U.S.C. 154(b) by 55 days.

(21) Appl. No.: 12/463,319

(22) Filed: May 8, 2009

(65) Prior Publication Data

US 2009/0278110 A1     Nov. 12, 2009

Related U.S. Application Data

(60) Provisional application No. 61/052,170, filed on May 10, 2008.

(51) Int. Cl.
    *H01L 21/00*    (2006.01)
(52) U.S. Cl. .................... 438/104; 257/E21.175
(58) Field of Classification Search .............. 438/104, 438/260; 257/E21.479
    See application file for complete search history.

(56) References Cited

U.S. PATENT DOCUMENTS

| | | | |
|---|---|---|---|
| 5,689,281 A * | 11/1997 | Nomura | 345/94 |
| 6,835,949 B2 | 12/2004 | Weiss et al. | |
| 6,944,052 B2 | 9/2005 | Sumramanian et al. | |
| 6,965,137 B2 | 11/2005 | Kinney et al. | |
| 7,038,935 B2 | 5/2006 | Rinerson et al. | |
| 7,067,862 B2 | 6/2006 | Rinerson et al. | |
| 7,157,783 B2 | 1/2007 | Marsh | |
| 7,372,065 B2 | 5/2008 | Kozicki et al. | |
| 7,420,198 B2 | 9/2008 | Baek et al. | |
| 7,495,947 B2 | 2/2009 | Scheuerlein et al. | |
| 7,551,473 B2 | 6/2009 | Lung et al. | |
| 7,569,459 B2 | 8/2009 | Karg et al. | |
| 7,615,769 B2 | 11/2009 | Kim | |
| 2004/0043578 A1 | 3/2004 | Marsh | |
| 2006/0073657 A1 | 4/2006 | Herner et al. | |
| 2006/0076549 A1 | 4/2006 | Ufert | |
| 2006/0245243 A1 | 11/2006 | Rinerson et al. | |
| 2006/0250836 A1 | 11/2006 | Herner et al. | |
| 2006/0250837 A1 | 11/2006 | Herner et al. | |
| 2006/0255392 A1 | 11/2006 | Cho et al. | |
| 2007/0008773 A1 | 1/2007 | Scheuerlein | |
| 2007/0008785 A1 | 1/2007 | Scheuerlein | |
| 2007/0114509 A1 | 5/2007 | Herner | |
| 2007/0132049 A1 | 6/2007 | Stipe | |

(Continued)

FOREIGN PATENT DOCUMENTS

GB    2344694 A    6/2000

(Continued)

OTHER PUBLICATIONS

International Search Report, PCT Application PCT/US2009/042424, Dec. 14, 2009.

(Continued)

*Primary Examiner* — Chandra Chaudhari

(57) ABSTRACT

Non-volatile resistive-switching memories formed using anodization are described. A method for forming a resistive-switching memory element using anodization includes forming a metal containing layer, anodizing the metal containing layer at least partially to form a resistive switching metal oxide, and forming a first electrode over the resistive switching metal oxide. In some examples, an unanodized portion of the metal containing layer may be a second electrode of the memory element.

7 Claims, 11 Drawing Sheets

U.S. PATENT DOCUMENTS

| | | | |
|---|---|---|---|
| 2007/0164309 | A1 | 7/2007 | Kumar et al. |
| 2007/0164388 | A1 | 7/2007 | Kumar et al. |
| 2007/0228354 | A1 | 10/2007 | Scheuerlein |
| 2007/0236981 | A1 | 10/2007 | Herner |
| 2007/0252193 | A1 | 11/2007 | Cho et al. |
| 2007/0267667 | A1 | 11/2007 | Ufert |
| 2007/0285967 | A1 | 12/2007 | Toda et al. |
| 2007/0295950 | A1 | 12/2007 | Cho et al. |
| 2008/0001172 | A1 | 1/2008 | Karg et al. |
| 2008/0006907 | A1 | 1/2008 | Lee et al. |
| 2008/0011996 | A1 | 1/2008 | Bednorz et al. |
| 2008/0090337 | A1 | 4/2008 | Williams |
| 2008/0093744 | A1* | 4/2008 | Wang et al. .......... 257/758 |
| 2008/0164568 | A1 | 7/2008 | Lee et al. |
| 2008/0203377 | A1 | 8/2008 | Choi et al. |
| 2008/0211036 | A1 | 9/2008 | Zhao et al. |
| 2008/0316796 | A1 | 12/2008 | Herner |
| 2009/0003083 | A1 | 1/2009 | Meeks et al. |
| 2009/0026434 | A1 | 1/2009 | Malhotra et al. |
| 2009/0134431 | A1 | 5/2009 | Tabata et al. |
| 2009/0268508 | A1 | 10/2009 | Chen et al. |
| 2009/0272959 | A1 | 11/2009 | Phatak et al. |
| 2009/0272961 | A1 | 11/2009 | Miller et al. |
| 2009/0272962 | A1 | 11/2009 | Kumar et al. |

FOREIGN PATENT DOCUMENTS

| | | |
|---|---|---|
| KR | 10-2000-0048092 A | 3/2004 |
| KR | 10-2006-0117023 A | 11/2006 |
| KR | 10-2007-0062435 A | 6/2007 |

OTHER PUBLICATIONS

Chen et al., HfOx Thin Films for Resistive Memory Device by Use of Atomic Layer Deposition, Mater. Res. Soc. Symp. Proc., 2007, vol. 997, Materials Research Society.

Inoue et al., Nonpolar resistance switching of metal/binary-transition-metal oxides/metal sandwiches: homogenous/inhomogenous transition of current distribution., Phys. Rev. B 77, 035105 (2008), American Physical Society.

Kim et al., Anode-interface localized filamentary mechanism in resistive switching of TiO2 thin films, Applied Physics Letters, Jul. 6, 2007, pp. 012907-1-012907-3, vol. 91, American Institute of Physics.

Lee et al., Low Power Switching of Nonvolatile Resistive Memory Using Hafnium Oxide, Japanese Journal of Applied Physics, Apr. 24, 2007, pp. 2175-2179, vol. 46, No. 4B, The Japan Society of Applied Physics.

Lee et al., Resistance Switching Behaviors of Hafnium Oxide Films Grown by MOCVD for Nonvolatile Memory Applications, Journal of the Electrochemical Society, Dec. 6, 2007, pp. H92-H96, vol. 155 (2), The Electrochemical Society.

Sanchez et al., A mechanism for unipolar resistance switching in oxide nonvolatile memory devices, Dec. 17, 2007, Applied Physics Letters, pp. 252101-1-252101-3, vol. 91, American Institute of Physics.

Yang et al., Memristive switching mechanism for metal/oxide/metal nanodevices, Jun. 15, 2008, Nature Nanotechnology, pp. 429-433, vol. 3, Jul. 2008, Macmillan Publishers Limited.

Smyth, The defect chemistry or metal oxides, Chapters 1-5, 8, 9, and 12, pp. 1-74, 118-161, and 217-237, 2000, Oxford University Press, Inc.

Baek et al., Highly Scalable Non-volatile Resistive Memory using Simple Binary Oxide Driven by Asymmetric Unipolar Voltage Pulses, 2004, IEEE, pp. 23.6.1-23.6.4, IEDM 04-587.

Toriumi et al., Doped HfO2 for Higher-k Dielectrics, 208th ECS Meeting, Abstract #508, 2005, The Electrochemical Society.

Lee et al., HfOx Biploar Resistive Memory with Robust Endurance Using AlCu as Buffer Electrode, Jul. 2009, IEEE Electron Device Letters, vol. 30, No. 7, pp. 703-705, IEEE.

International Search Report, PCT Application PCT/US2009/041582, Dec. 14, 2009.

International Search Report, PCT Application PCT/US2009/041583, Nov. 30, 2009.

Chan et al., Resistive switching effects of HfO2 high-k dielectric, Sep. 25, 2008, Microelectronic Engineering, pp. 2420-2424, vol. 85, Elsevier B.V.

Chen et al., Highly Scalable Hafnium Oxide Memory with Improvements of Resistive Distribution and Read Disturb Immunity, 2009, IEEE, pp. IEDM09-105-IEDM09-108.

U.S. Appl. No. 12/608,934, filed Oct. 29, 2009.
U.S. Appl. No. 12/610,236, filed Oct. 30, 2009.
U.S. Appl. No. 12/705,474, filed Feb. 12, 2010.

* cited by examiner

NON-VOLATILE RESISTIVE-SWITCHING MEMORIES FORMED USING ANODIZATION

PRIORITY CLAIM TO PROVISIONAL APPLICATION

A claim for priority is hereby made under the provisions of 35 U.S.C. § 119 for the present application based upon U.S. Provisional Application No. 61/052,170 entitled "Non-Volatile Resistive Switching Memories" and filed on May 10, 2008, which is incorporated herein by reference.

FIELD OF THE INVENTION

The present invention relates generally to electronic memories. More specifically, non-volatile resistive-switching memories formed using anodization are described.

BACKGROUND OF THE INVENTION

Nonvolatile memories are semiconductor type memories that retain their contents when unpowered. Nonvolatile memories are used for storage in electronic devices such as digital cameras, cellular telephones, and music players, as well as in general computer systems, embedded systems and other electronic devices that require persistent storage. Nonvolatile semiconductor memories can take the form of removable and easily transportable memory cards or other memory modules, can be integrated into other types of circuits or devices, or can take any other desired form. Nonvolatile semiconductor memories are becoming more prevalent because of their advantages of being small and persistent, having no moving parts, and requiring little power to operate.

Flash memory is a common type of nonvolatile memory used in a variety of devices. Flash memory is a transistor-based memory device that uses multiple gates per transistor and quantum tunneling to store the contents of a memory cell. Flash memory uses a block-access architecture that can result in long access, erase, and writing times.

The speeds of electronic devices and the storage demands of users are rapidly increasing. Flash memory is proving to be inadequate for nonvolatile memory needs. Additionally, volatile memories (such as random access memory (RAM)) can potentially be replaced by nonvolatile memories if the speeds of nonvolatile memories are increased to meet the requirements for RAM and other currently volatile memories.

Thus, what is needed is a new type of nonvolatile memory. Memories that include elements which exhibit changes in resistive states in response to the application of voltages have been described. These memories typically have operational and durability limitations. Therefore, a resistive-switching memory with improved operational and durability characteristics is desired.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, resistive-switching memory elements can be formed using electrochemical oxidation (anodization) techniques. The resistive-switching memory elements can be formed using a resistive switching metal oxide that is sandwiched by two conductors in a metal-insulator-metal (MIM) style structure. The structure can be formed by depositing a metal-containing layer on a substrate, and either partially- or fully-anodizing the metal containing layer to form the resistive-switching metal oxide. Anodized resistive-switching metal oxides can have to different crystallographies and stoichiometries that are not possible using conventional techniques (e.g. physical vapor deposition (PVD)). Additionally, anodization can be used to form a sufficiently oxidized metal oxide without using annealing, which allows the use of heat sensitive materials in the memory structures.

In one example, hafnium oxide films can be formed using anodization. Nonstoichiometric hafnium oxide films with a mixture of monoclinic and tetragonal phases (i.e. includes metallic Hf—Hf bonds) have demonstrated promising switching behavior (See, e.g. FIGS. 5A-5D). Similar oxides (e.g. higher-bandgap materials, titanium oxide, etc.) have similar characteristics. While these films have previously been prepared using other deposition techniques, electrochemical anodization can have additional advantages by creating different nonstoichiometries (e.g. very low stoichiometries) of the material in addition to the creation of metallic bonds. At the same time this electrochemical oxidation is compatible with the typical semiconductor manufacturing techniques. Further, anodization can be performed using low temperature processes, which can be advantageous as the lower temperatures allow the use of certain materials (e.g. copper, aluminum) that would otherwise be precluded.

I. Memory Structure

Figure 1:
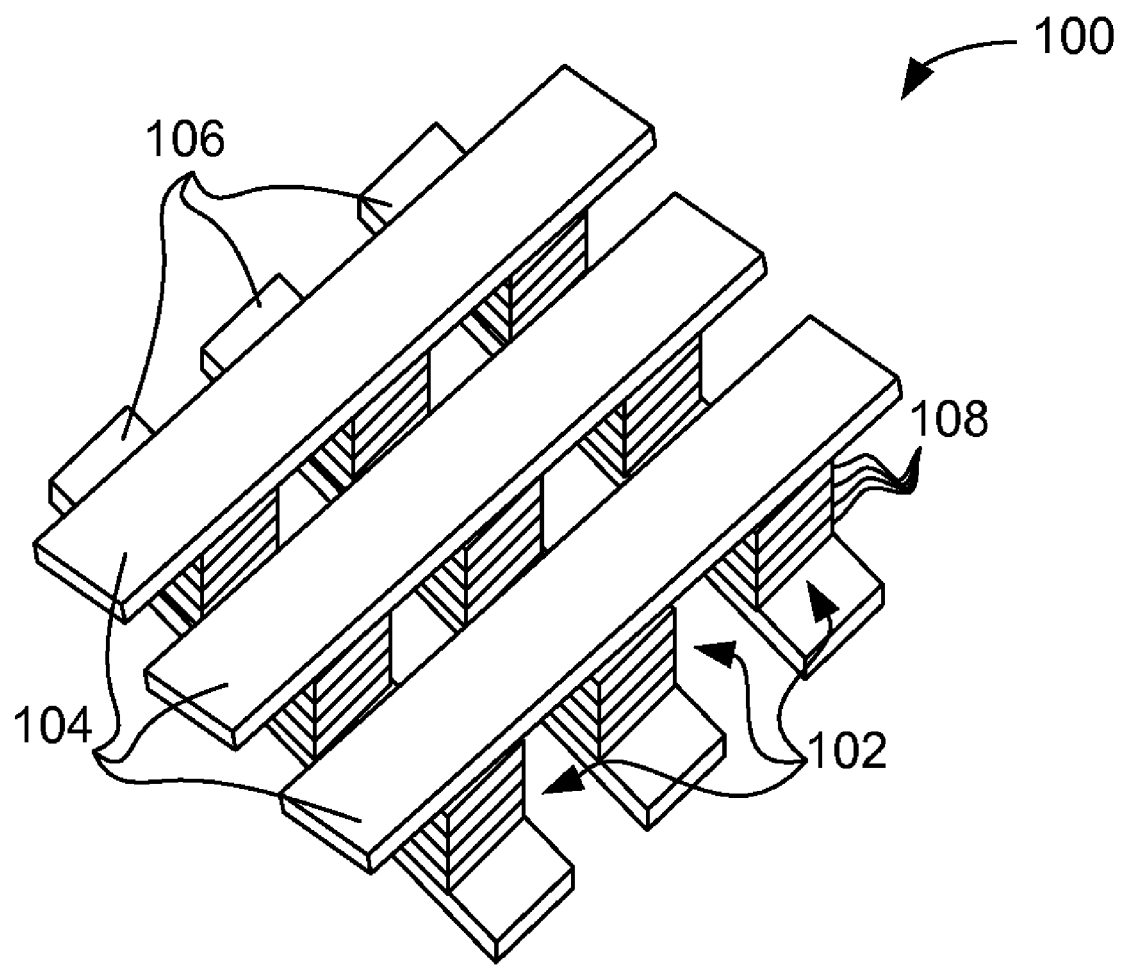
FIG. 1 illustrates a memory array of resistive switching memory elements.

FIG. 1 illustrates a memory array 100 of resistive switching memory elements 102. Memory array 100 may be part of a memory device or other integrated circuit. Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a nonvolatile memory device from resistive switching memory elements such as element 102. For example, horizontal and vertical lines 104 and 106 may be connected directly to the terminals of resistive switching memory elements 102. This is merely illustrative.

Figure 4:
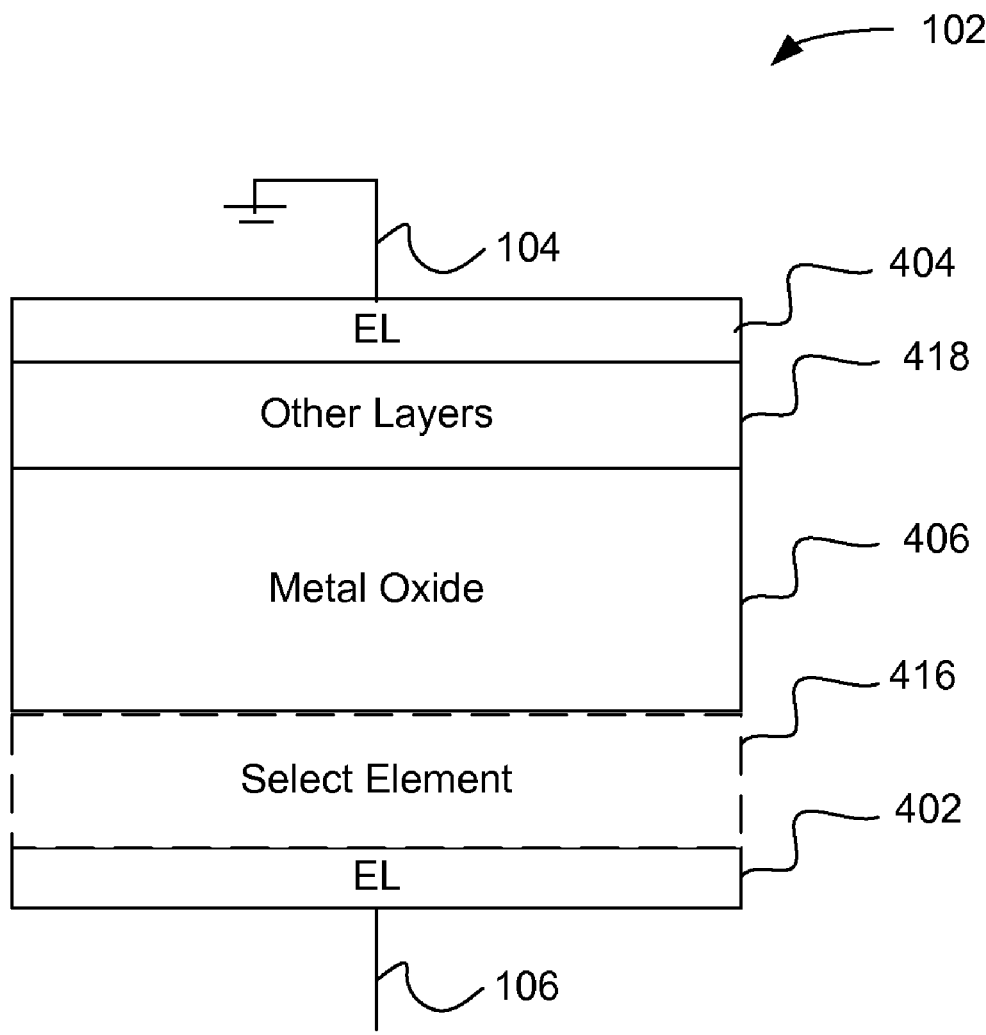
FIG. 4 illustrates an exemplary memory element according to various embodiments.
Figure 4:
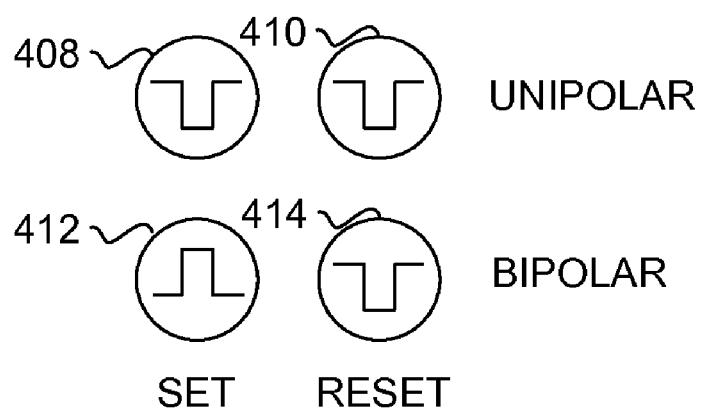

If desired, other electrical devices may be associated (i.e. be one or more of the layers 108) with each memory element 102 (see, e.g. FIG. 4). These devices, which are sometimes referred to as current steering elements, may include, for example, diodes, p-i-n diodes, silicon diodes, silicon p-i-n diodes, transistors, etc. Current steering elements may be connected in series in any suitable locations in memory element 102.

II. Memory Operation

During a read operation, the state of a memory element 102 can be sensed by applying a sensing voltage (i.e. a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e. a "1" bit). If, on the other hand, the memory element has a low resistance, the memory element may be said to contain a logic zero (i.e. a "0" bit). During a write operation, the state of a memory element can be changed by application of suitable write signals to an appropriate set of signal lines 104 and 106.

Figure 2A:
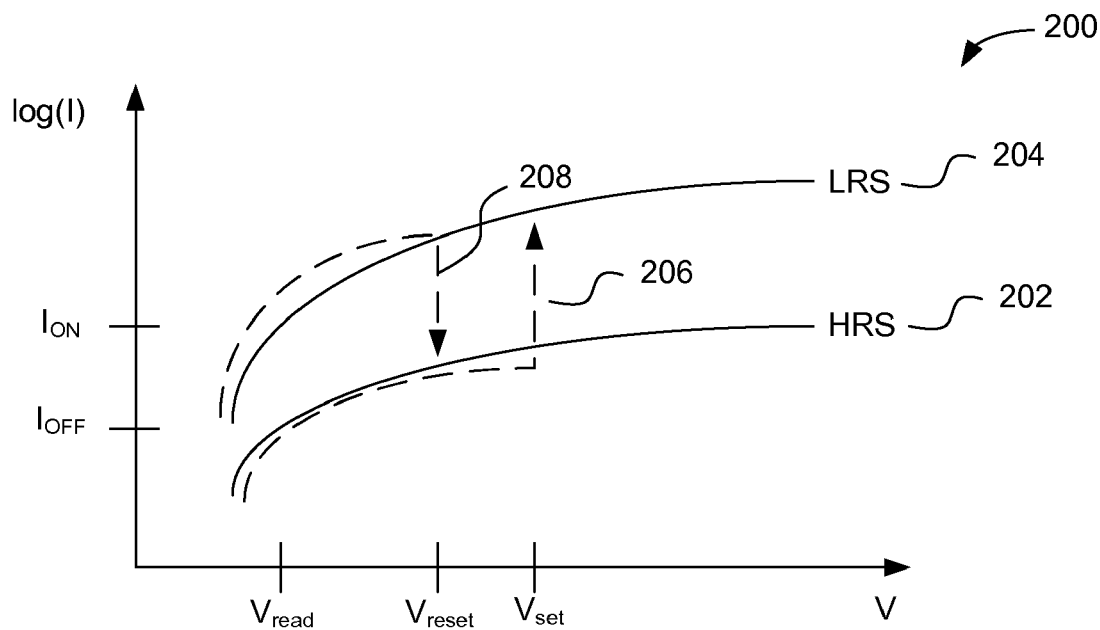
FIG. 2A is a logarithm of current (I) versus voltage (V) plot for a memory element.

FIG. 2A is a logarithm of current (I) versus voltage (V) plot 200 for a memory element 102. FIG. 2A illustrates the set and reset operations to change the contents of the memory element 102. Initially, memory element 102 may be in a high resistance state ("HRS", e.g. storing a logic zero). In this state, the current versus voltage characteristic of memory element 102 is represented by solid line HRS 202. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 206. In this region, the memory element 102 is changed so that, following removal of the set voltage $V_{SET}$, memory element 102 is characterized by low resistance curve LRS 204. As is described further below, the change in the resistive state of memory element 102 may be because of the filling of traps (i.e. a may be "trap-mediated") in a metal oxide material.

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 208. When the reset voltage $V_{RESET}$ is removed from memory element 102, memory element 102 will once again be characterized by high resistance line HRS 204. Voltage pulses (see FIG. 4) can be used in the programming of the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially switches, the set and reset voltages can be used to change the resistance state of the memory element 102.

The bistable resistance of resistive switching memory element 102 makes memory element 102 suitable for storing digital data. Because no changes take place in the stored data in the absence of application of the voltages $V_{SET}$ and $V_{RESET}$, memory formed from elements such as element 102 is nonvolatile. As can be appreciated, it is desirable for memory element 102 to have a large difference between off current and on current (i.e. a high $I_{ON}/I_{OFF}$ ratio), which causes the on and off states of the memory element to be more discrete and easily detectable.

III. Switching Mechanisms

A. Bulk-Mediated Switching

In its most basic form, the layers 108 of the memory element 102 include two electrodes (each having one or more materials and/or layers) and one or more layers of one or more metal oxides disposed in between. The memory element 102 generally has a metal-insulator-metal (MIM) capacitor structure, although other structures such as metal-insulator-insulator-metal (MIIM) and metal-insulator-insulator-insulator-metal (MIIIM) can be used as described herein.

Without being bound by theory, and in some embodiments, the memory element 102 can use a switching mechanism that is mediated in the bulk of the metal oxide. In one embodiment, the switching mechanism uses non-metallic conductive paths rather than filamentary or metallic conductive paths. Generally, defects are formed in, already exist in the deposited metal oxide, and existing defects can be enhanced by additional processes. Defects may take the form of variances in charge in the structure of the metal oxide. For example, some charge carriers may be absent from the structure (i.e. vacancies) or additional charge carriers may be present (i.e. interstitials). Therefore, by applying a voltage to the memory element 102, the defects, such as traps, can either be filled or emptied to alter the resistivity of a metal oxide and resistive switching memory elements can be formed using these principles.

For certain materials, the set voltage can be shown to be dependent on the thickness of the metal oxide layer (see discussion regarding FIGS. 3A-3C) which indicates a bulk-mediated switching mechanism. Generally, the bulk-mediated switching mechanism forms percolation paths through the bulk of the metal oxide. However, in some embodiments, the metal oxide can be one that uses an interface-mediated or other switching mechanism.

Figure 2B:
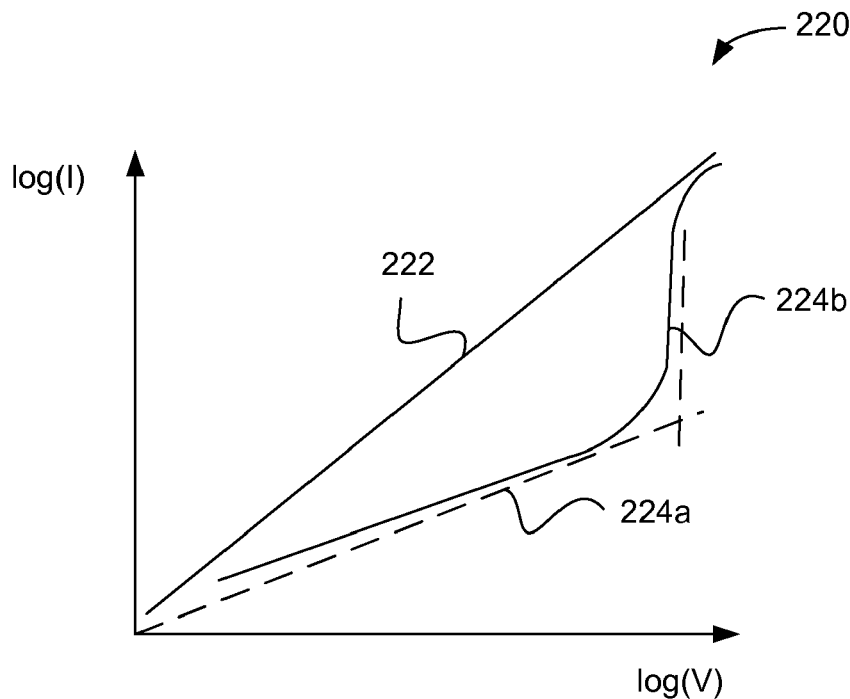
FIG. 2B is a logarithm of current (I) versus logarithm voltage (V) plot for a memory element that demonstrates a resistance state change.

FIG. 2B is a current (I) versus voltage (V) plot 220 for a memory element 102 that demonstrates a resistance state change. The plot 220 shows a voltage ramp applied to the memory element 102 along the x-axis and the resulting current along a y-axis. The line 222 represents the response of an Ohmic material when the ramped voltage is applied. An Ohmic response is undesirable, since there is no discrete voltage at which the set or reset occurs.

Generally, a more abrupt graph like graph 224 is desired. The graph 224 begins with an Ohmic response 224a, and then curves sharply upward 224b. The graph 224 may represent a set operation, where the memory element 102 switches from the HRS 202 to the LRS 204.

The set voltage shown here is very discrete (i.e. vertical), which is desirable to ensure the switching of the memory element occurs at a repeatable voltage. Additionally, a high ratio of on current to off current (i.e. a high $I_{ON}/I_{OFF}$ ratio), for example 10 or greater, is desirable because it indicates a large difference in the resistivity of the metal oxide when in the HRS and LRS, making the state of the memory element easier to determine. Finally, it is desirable to have low set, reset, and switching voltages in order to avoid damage to the memory elements and to be compatible with complementary device elements (see FIG. 4) such as diodes and/or transistors in series with the memory element 102.

B. Defects

The metal oxide includes electrically active defects (also known as traps) in the bulk. It is believed that the traps can be filled by the application of the set voltage, and emptied by applying the reset voltage. Traps can be inherent in the metal oxide (i.e. existing from formation of the metal oxide) or created by doping, and enhanced by doping and other processes. For example, a hafnium oxide layer may include oxygen or hafnium vacancies or oxygen or hafnium interstitials that may form traps which can be used to create percolation paths and alter the conductivity of the hafnium oxide layer.

A metal oxide may include defects that are the result of the process used to form the metal oxide. In other words, the defects may be inherent in the metal oxide. For example, PVD and anodization techniques described herein can lead to imperfections in the crystal structure of the metal oxide layers. These imperfections can generally be referred to as defects in the structure of the metal oxide. The defects can be used to create localized charge variances that can be filled and emptied by applying voltage pulses to the metal oxides.

C. Scaling and Bandgap

Figure 3A:
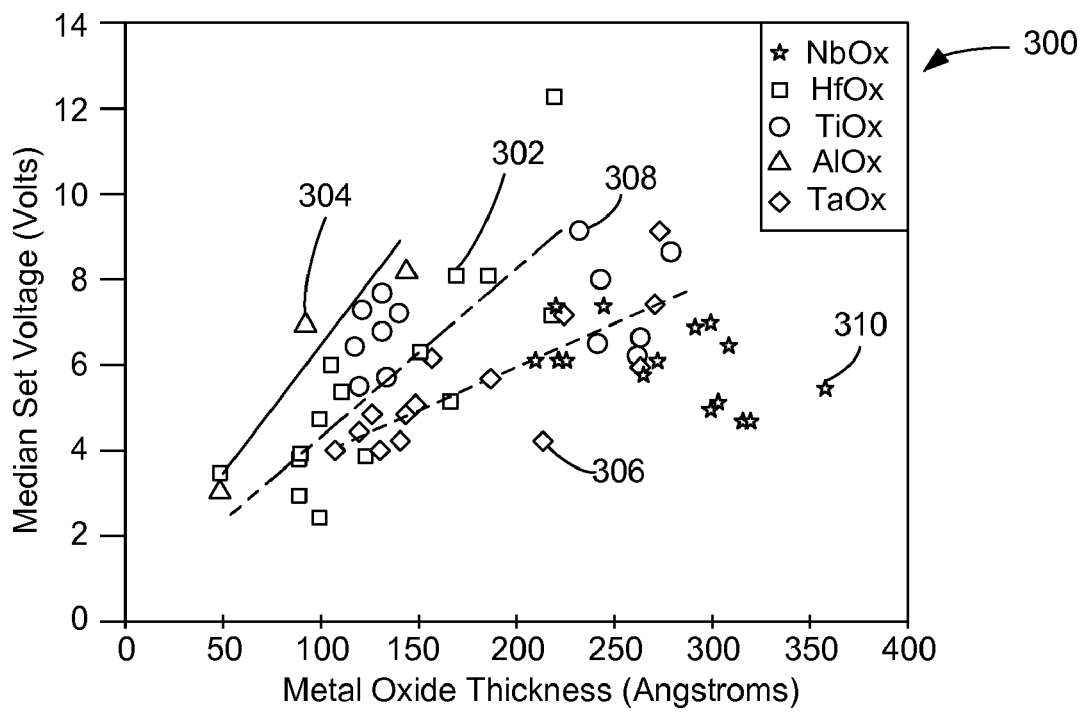
FIGS. 3A-3C are graphs showing the relationship between thickness of a metal oxide layer and set voltage, reset voltage, and on/off current ratios for several materials systems used in memory elements described herein.
Figure 3B:
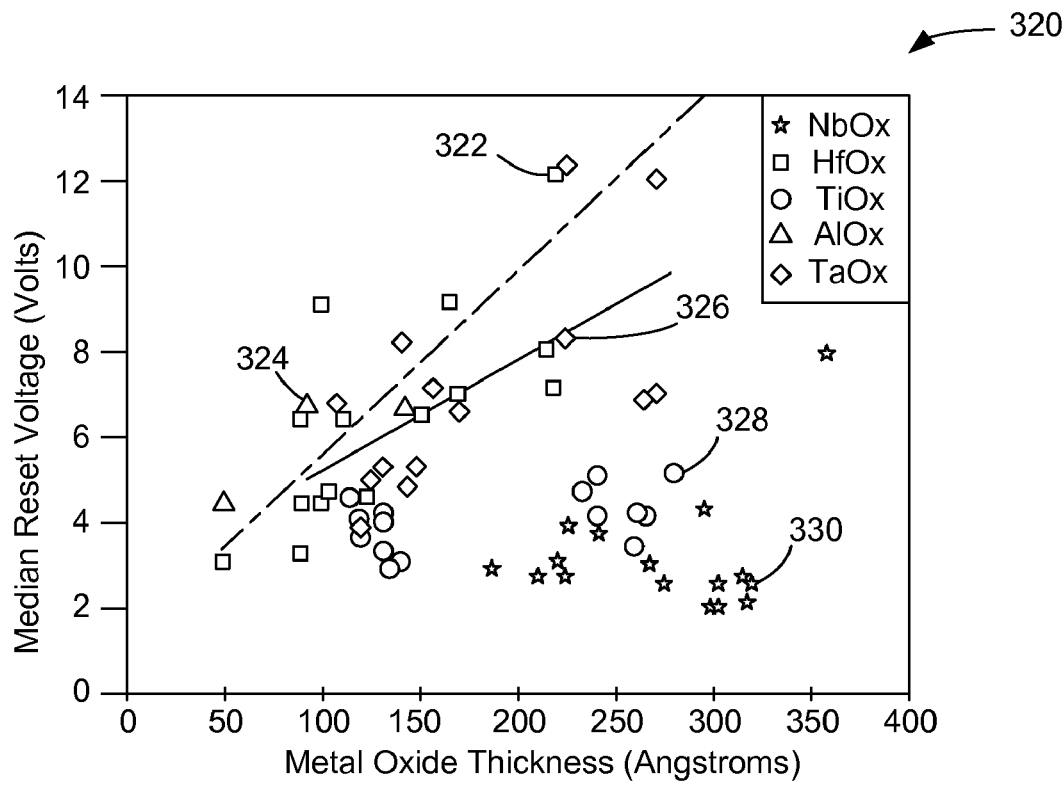
Figure 3C:
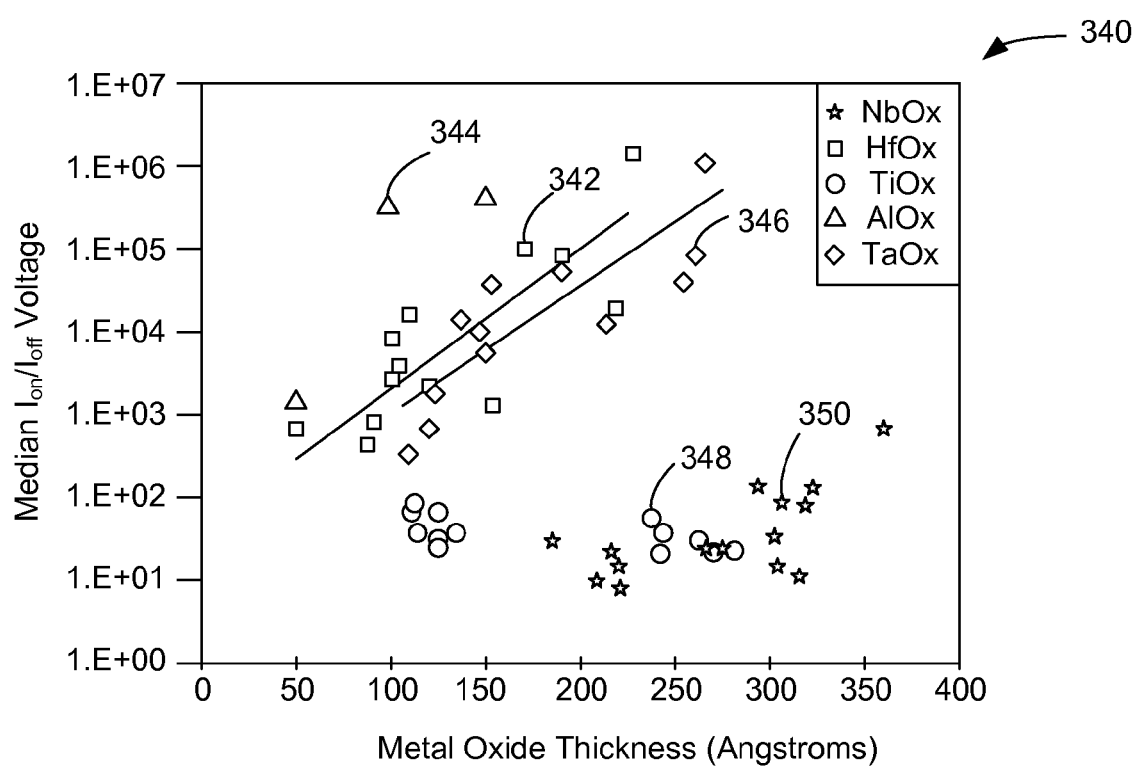

FIGS. 3A-3C are graphs showing the relationship between thicknesses of a metal oxide layer and resulting set voltages, reset voltages, and on/off current ratios for several materials systems used in memory elements described herein. These graphs describe a system that includes two electrodes and a single layer of metal oxide disposed in between. As can be seen in FIG. 3A, for hafnium oxide 302, aluminum oxide 304, and tantalum oxide 306, set voltage increases with (i.e. is dependent on) thickness, and in some embodiments and for these materials the set voltage is at least one volt (V) per one hundred angstroms (Å) of the thickness of a metal oxide layer in the memory element. In some embodiments, an increase in the thickness of the metal oxide layer of 100 Å increases the set voltage by at least 1V. Similarly, as shown in FIG. 3B, reset voltage for hafnium oxide 322, aluminum oxide 324, and tantalum oxide 326 also depends on thickness. These data therefore support a bulk-controlled set/reset mechanism for these materials, since a linear relationship indicates the formation of percolation paths throughout the bulk of the metal oxide. In other words, for a thicker material, more voltage is needed to fill the traps.

Hafnium oxide (5.7 electron volts (eV)), aluminum oxide (8.4 eV) and tantalum oxide (4.6 eV) all have a bandgap greater than 4 eV, while titanium oxide (3.0 eV) and niobium oxide (3.4 eV) have bandgaps less than 4 eV. As shown in FIGS. 3A and 3B, set voltages for titanium oxide 308 and niobium oxide 310 and reset voltages for titanium oxide 328 and niobium oxide 330 do not increase with thickness. Therefore, a higher bandgap (i.e. bandgap greater than 4 eV) metal oxide exhibits bulk mediated switching and scalable set and reset voltages. In other words, set and reset voltages can be reduced by reducing the thickness of the high bandgap metal oxides such as hafnium oxide. Therefore, for smaller devices, set and reset voltages can be lowered.

FIG. 3C shows a relationship between the $I_{ON}/I_{OFF}$ ratio and the thickness of a metal oxide layer. Metal oxides that have bandgaps greater than 4 eV (i.e. hafnium oxide 342, aluminum oxide 344, and tantalum oxide 346, as well as other higher-bandgap materials such as zirconium oxide and yttrium oxide) show a scaling relationship between $I_{ON}/I_{OFF}$ ratio and thickness. Additionally, for increasing bandgap, the $I_{ON}/I_{OFF}$ ratio increases. Conversely, materials having a bandgap less than 4 eV (i.e. titanium oxide 348 and niobium oxide 350) exhibit an $I_{ON}/I_{OFF}$ ratio that is independent of oxide thickness. Additionally, the higher bandgap materials generally have higher $I_{ON}/I_{OFF}$ ratios, which improve the ability to distinguish between the off state and the on state of the memory element.

IV. Memory Element Structures

A. Metal Oxides

Specific base metal oxides that use bulk-mediated switching mechanisms according to embodiments of the invention include hafnium oxide, aluminum oxide, tantalum oxide, zirconium oxide, and yttrium oxide. These metal oxides have a bandgap that is greater than 4 eV, indicating that they are more insulating and therefore have a higher resistivity. As is explained regarding FIGS. 3A-3C, higher bandgap (i.e. greater than 4 eV) metal oxides also allow for scaling of set voltage as related to metal oxide thickness.

Although materials that use bulk-mediated switching mechanisms may in some embodiments be advantageous, other metal oxide materials (e.g. titanium oxide) have shown switching behavior and therefore may be useful for forming memory elements using the anodization techniques described herein.

B. Electrodes

Electrode materials may include silicon (e.g. doped silicon or polysilicon), silicides, titanium nitride (TiN), platinum, iridium, iridium oxide, ruthenium and ruthenium oxide. According to some embodiments, one electrode may be a higher work function material, and the other electrode may be a lower work function material. For example, in one embodiment, at least one electrode is a high work function material such as a noble or near noble metal (i.e. a metal with a low absolute value (i.e. negative or positive) free energy change ($|\Delta G|$) of oxide formation). Noble or near noble metals include iridium, iridium oxide, platinum, ruthenium, and ruthenium oxide. The other electrode may be a lower work function material such as titanium nitride, or may also be a noble or near noble material. In some embodiments, the reset pulse at the electrode having the higher work function is a positive pulse (i.e. the higher work function electrode is the anode of the memory element).

In other embodiments, the electrodes can be multi-layer electrodes that can include one or more different materials. For example, an electrode can include a layer of ruthenium and ruthenium oxide, or a layer of iridium, iridium oxide, or platinum with a capping layer of tungsten, tungsten carbonitride, or tungsten carbon. The multi-layer electrodes can be used to improve adhesion properties and performance of memory elements in some configurations and embodiments.

Other electrodes may include non-metallic electrodes such as doped silicon electrodes. For example, one or both of the electrodes can be a doped polysilicon, which can have processing and operational advantages.

C. Structure

FIG. 4 illustrates an exemplary memory element 102 according to various embodiments. As is described below, various different configurations of memory element 102 are possible; the memory element 102 shown in FIG. 4 is one example of a memory element 102 that can be used with memory array 100.

The memory element 102 includes two electrodes 402 and 404. The electrodes 402 and 404 can be formed using any appropriate process, such as PVD, CVD, ALD, etc., and can have any appropriate thickness, for example 10-2000 Å.

A bottom electrode 402 is, in some embodiments, nearer a substrate on which the memory element 102 is formed. A top electrode 404 is further from the substrate. Although "bottom" and "top" are used to describe the electrodes for some systems, it is understood that the memory element 102 may have any orientation relative to the substrate, signal lines, word lines and bit lines, or other components of the memory array 100, and that the memory element 102 may be formed in reverse order from what is shown.

The electrodes 402 and 404 may be adjacent to or otherwise in electrical communication with signal lines 104 and 106. The signal lines 104 and 106 can be any conductor such as tungsten, aluminum, or copper.

A metal oxide 406 is between the electrodes 402 and 404. The metal oxide 406 may in some embodiments be described as a transition metal oxide, and may be a binary metal oxide, ternary metal oxide, or some other combination of the materials described above. As described herein, the metal oxide can be formed using electrochemical oxidation (anodization) techniques. In some embodiments, the electrode 402 and the metal oxide 406 can be formed from the same metal containing layer—i.e. the metal containing layer can be partially anodized. In these embodiments, the unanodized portion of the metal containing layer becomes the electrode, while the anodized portion of the metal containing layer becomes a resistive-switching metal oxide. The electrodes 402 and 404 and the metal oxide 406 are layers 108 of the memory element 102 shown in FIG. 1.

1. Set and Reset Pulses

In one embodiment, the electrode 404 is grounded and voltage pulses are applied to the electrode 402. In a unipolar embodiment, for example, the set pulse 408 and reset pulse 410 are both negative. In a bipolar embodiment, the set pulse 412 is positive while the reset pulse 414 is negative. Alternatively, the electrode 402 is grounded and pulses are applied to the electrode 404. In the alternative embodiment, for unipolar switching, both the set and reset voltage pulses applied to the electrode 404 are positive. In the bipolar embodiment, the set voltage is negative and the reset voltage is positive.

The electrode that is positive for the reset voltage pulse is described herein as the anode. The anode is positive for reset, and may be either positive for the set (for unipolar embodiments) or negative for the set (for bipolar embodiments). Generally, the set and reset voltages may either have a same relative polarity (unipolar) or a different relative polarity (bipolar).

2. Select Element

The memory element 102 can include an optional complementary device such as a select element 416. The select element 416 is in series with the memory element 102, and may be, for example, a diode or transistor. The select element 416 can be located anywhere within the memory element 102 (e.g. between the metal oxide 406 and the electrode 404).

3. Other Layers

The memory element 102 can also include other layers 418. For example, other layers 418 may include a buffer layer to prevent interaction between the electrode 404 and the metal oxide 406. The buffer layer 404 may include a same metal as the electrode 404. For example, the buffer layer 404 may be titanium oxide and the electrode could be titanium nitride. Having a same metal may prevent migration of titanium from the electrode 404 into the metal oxide 406.

4. Experimental Results i. Electrical Data

Figures 5A, 5B:
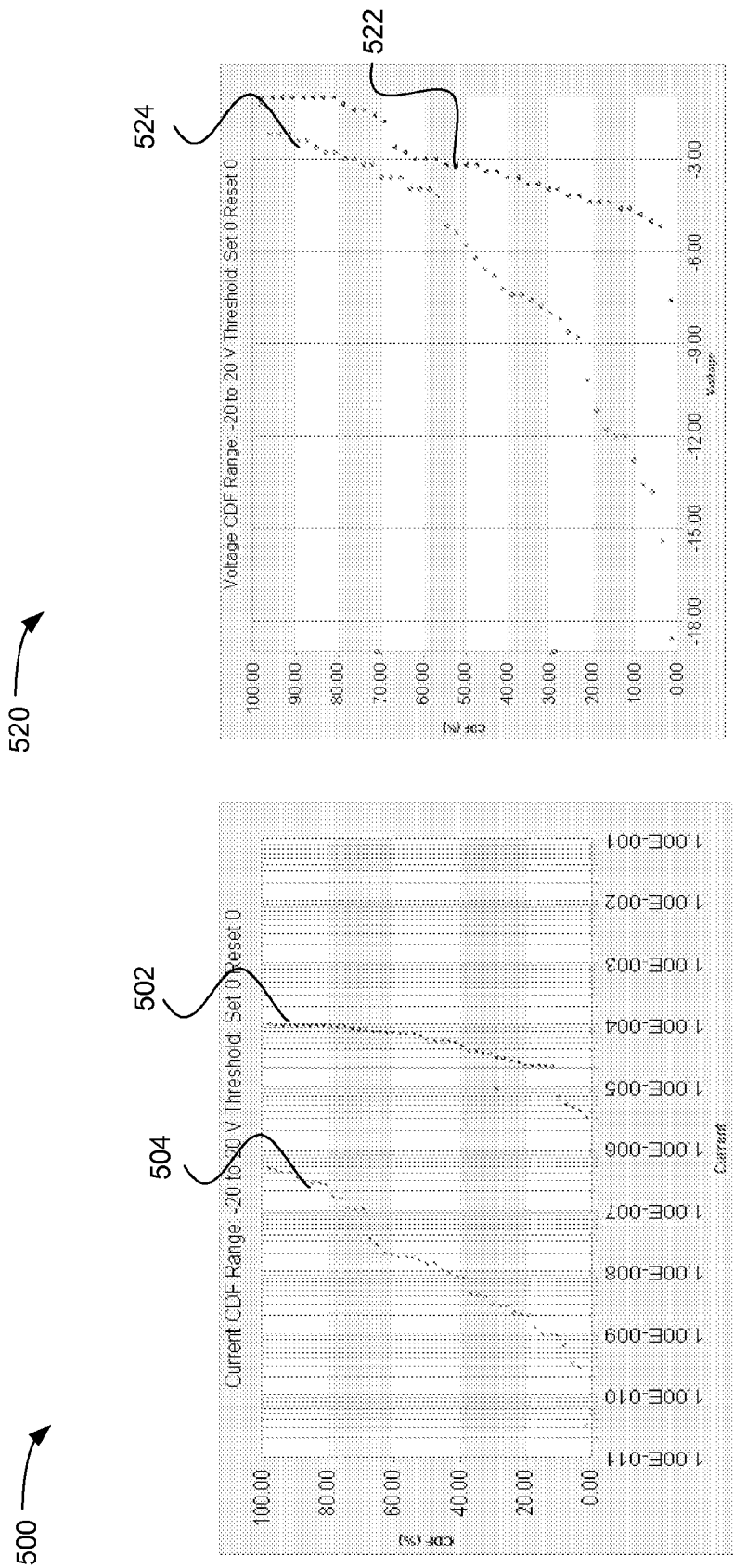
FIGS. 5A and 5B are distribution graphs and showing the $I_{ON}/I_{OFF}$ ratio and set and reset voltage distribution for a hafnium oxide memory element prepared using an anodization technique described herein.

One system that meets the criteria of low set, reset, and forming voltages and a high on/off ratio is a single layer hafnium oxide memory element 102. The memory element formed herein was formed by anodizing at 15 V for 60 seconds in 0.1 M sulfuric acid. The hafnium oxide layer is formed on a titanium nitride bottom electrode, and has a platinum top electrode formed thereon. FIGS. 5A and 5B are distribution graphs 500 and 520 showing the $I_{ON}/I_{OFF}$ ratio and set and reset voltage distribution for a hafnium oxide memory element prepared using an anodization technique described herein. The process yielded 66% (i.e. 66% of samples continued switching after 20 cycles) and did not require annealing. Therefore, the anodization technique can advantageously form switchable oxides without using high temperature treatments (e.g. annealing).

The distribution graph 500 shows an on current 502 and an off current 504 for several memory elements formed using the anodization process described herein. The ratio of the on current 502 to the off current 504 is high so as to be able to easily distinguish an on state from an off state. Additionally, the on current 502 is low enough to protect the memory element and any associated devices (e.g. diodes, transistors, etc.) The distribution graph 520 shows a set voltage 522 and a reset voltage 524 for several memory elements formed using the anodization process described above. The set and reset voltages 522 and 524 are low and discrete for a large number of samples.

ii. X-Ray Diffraction (XRD) Data

Figure 5C:
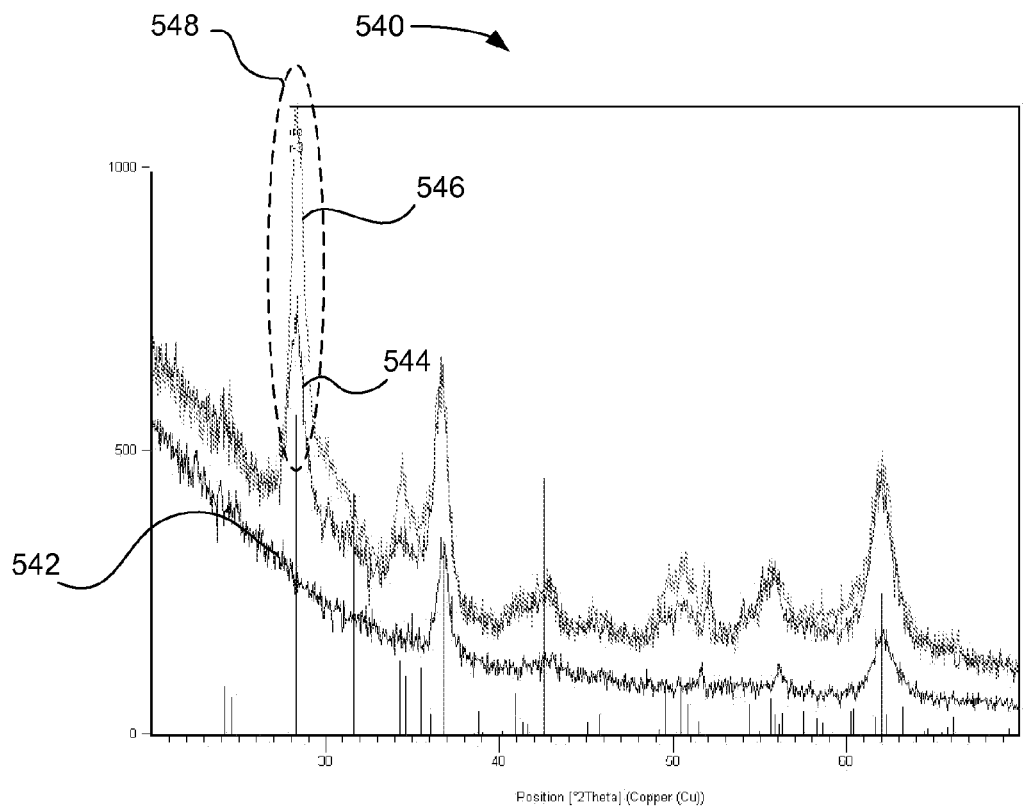
FIG. 5C is an X-Ray Diffraction (XRD) graph illustrating the phase of hafnium oxides deposited using PVD.
Figure 5D:
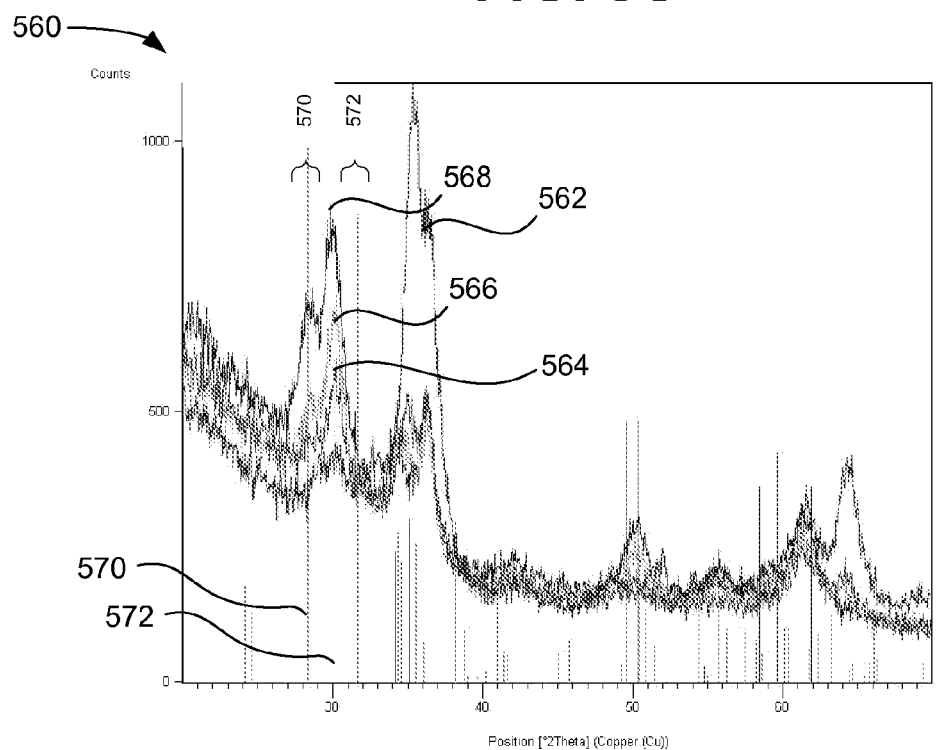
FIG. 5D is an XRD graph illustrating the phases of hafnium oxides deposited using anodization.

FIG. 5C is an X-Ray Diffraction (XRD) graph 540 illustrating the phase of hafnium oxides deposited using PVD. FIG. 5D is an XRD graph 560 illustrating the phases of hafnium oxides deposited using anodization. The hafnium oxides are deposited on titanium nitride bottom electrodes.

FIG. 5C shows XRD data for a 261 Å PVD hafnium oxide sample deposited on titanium nitride. Three plots are shown: a plot 542 for titanium nitride before the deposition of hafnium oxide, a plot 544 for PVD deposited hafnium oxide on titanium nitride before annealing, and a plot 546 for PVD deposited hafnium oxide on titanium nitride after annealing. A peak 548 at 28.4° indicates the presence of monoclinic hafnium oxide. As can be seen, the peak is not present in the titanium nitride sample represented by the plot 542, is present in the pre-anneal sample represented by the plot 544, and is enhanced by an anneal as illustrated by the plot 546. Therefore, annealing may be required for PVD samples in order to enhance the presence of hafnium oxide, which can preclude the use of certain materials.

The tetragonal phase of hafnium oxide can have certain advantages for resistive switching memories. The tetragonal phase of hafnium oxide is generally not present or weakly present when hafnium oxide is deposited using PVD techniques, but can be seen with anodized hafnium oxide. FIG. 5D is an XRD graph 560 including four plots: a plot 562 for bare titanium nitride, a plot 564 for a metallic hafnium sample deposited on titanium nitride that was anodized into hafnium oxide for 10 seconds at 30 volts using 0.1 M sulfuric acid, a plot 566 for a metallic hafnium sample deposited on titanium nitride that was anodized into hafnium oxide for 60 seconds at 30 volts using 0.1 M sulfuric acid, and a plot 568 for a metallic hafnium sample deposited on titanium nitride that was anodized into hafnium oxide for 240 seconds at 30 volts using 0.1 M sulfuric acid. A peak 570 at roughly 28.4° indicates monoclinic-phase hafnium oxide, while a peak 572 at roughly 30.1° indicates tetragonal-phase hafnium oxide. The peak 572 is not present in the PVD sample represented by plots 544 and 546 shown in FIG. 5C. The anodized hafnium oxide therefore has advantageous crystalline phases which are not present in PVD deposited samples.

5. Other Memory Elements

Other metal oxides 406 may include high bandgap materials such as zirconium oxide, aluminum oxide, yttrium oxide, and tantalum oxide. In other embodiments, lower bandgap materials, such as titanium oxide, have been shown to exhibit switching behavior and can also be used to form resistive-switching memory elements as described herein.

V. Memory Element Formation

The resistive-switching metal oxide of the memory elements 102 described above can be formed using electrochemical oxidation, also know as anodization. Generally, anodization is performed by completing an electrical circuit through an electrolytic solution (electrolyte). The circuit is created by attaching a power supply (e.g. a potentiostat) a metal to be anodized and a counter electrode which are both submerged in the electrolyte. The current causes oxidation to begin at the surface of the metal to be anodized. A resistive-switching metal oxide can be formed in this manner, and the resulting resistive switching metal oxide has advantageously low stoichiometry and desirable crystallinities.

Figure 6:
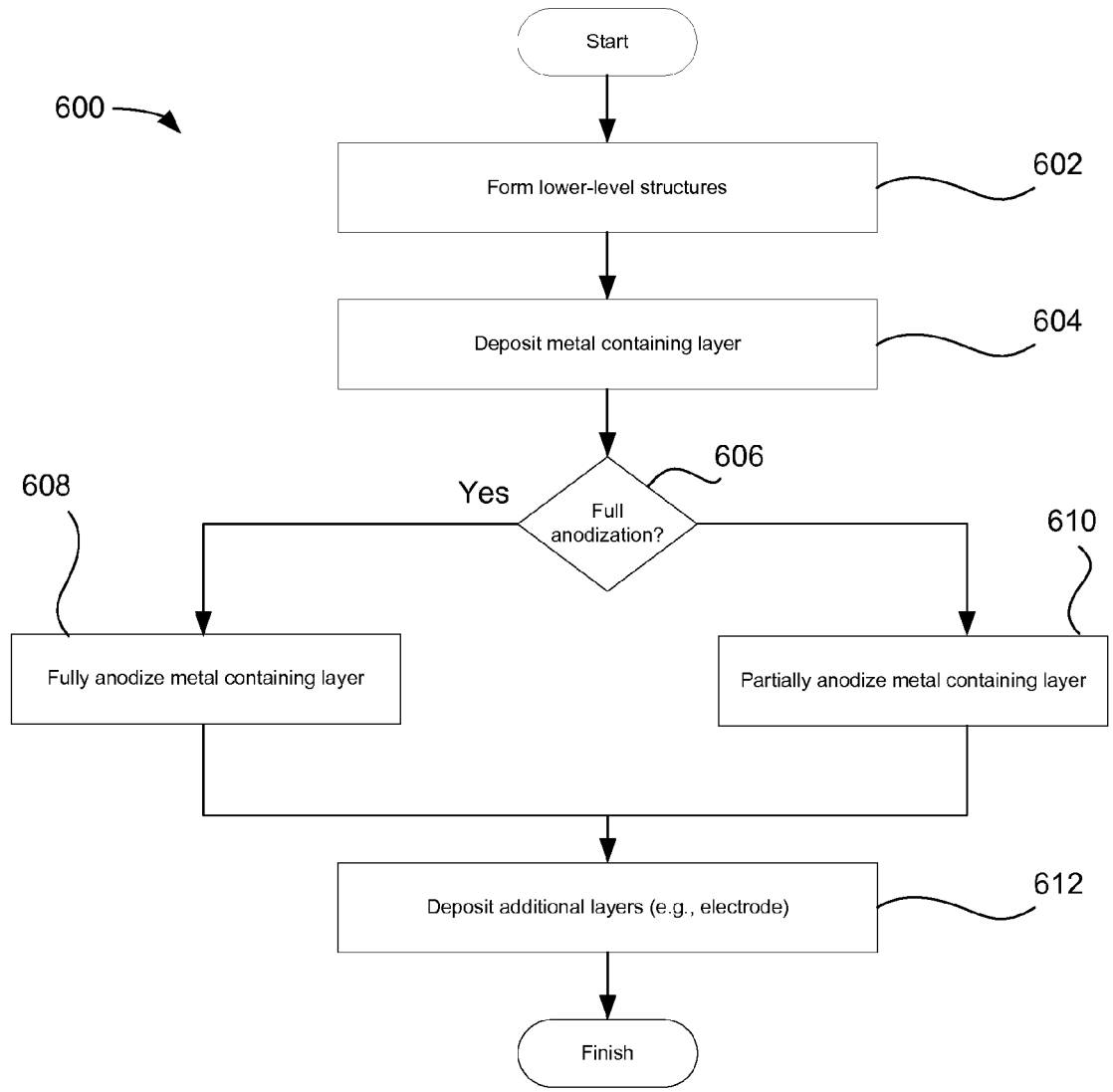
FIG. 6 describes a process for forming a metal oxide using electrochemical oxidation (anodization)

FIG. 6 describes a process 600 for forming a metal oxide using electrochemical oxidation (anodization). The process 600 describes techniques for forming the metal oxide using anodization and other integration techniques for creating a resistive-switching memory. Some portions of the process 600 may also include dry deposition techniques (e.g. PVD). FIGS. 7A-7F illustrate the formation of a memory element as described in the process 600. The process 600 can be useful for enabling site selective deposition of metal oxides for forming memory elements. Further, the metal oxide can be formed in situ.

Nonstoichiometric hafnium oxide films with a mixture structure of monoclinic and tetragonal (i.e. including metallic Hf—Hf bonds) have demonstrated promising switching behavior (See, e.g. FIGS. 5A-5D). Similar oxides (e.g. higher-bandgap materials, titanium oxide, etc.) have similar characteristics. While these films have previously been prepared using other deposition techniques, electrochemical oxidation can have additional advantages by creating different nonstoichiometries of the material in addition to the creation of metallic bonds. Additionally, electrochemical oxidation can be used to create metal oxides that include desirable defects, which can be used to enhance resistive-switching metal oxide layers. At the same time this electrochemical oxidation is compatible with the typical semiconductor manufacturing techniques. Further, in some embodiments anodization can be performed using low temperature processes (e.g. without annealing), which can be advantageous as the lower temperatures allow the use of certain materials (e.g. copper, aluminum) that would otherwise be precluded.

Figure 7A:
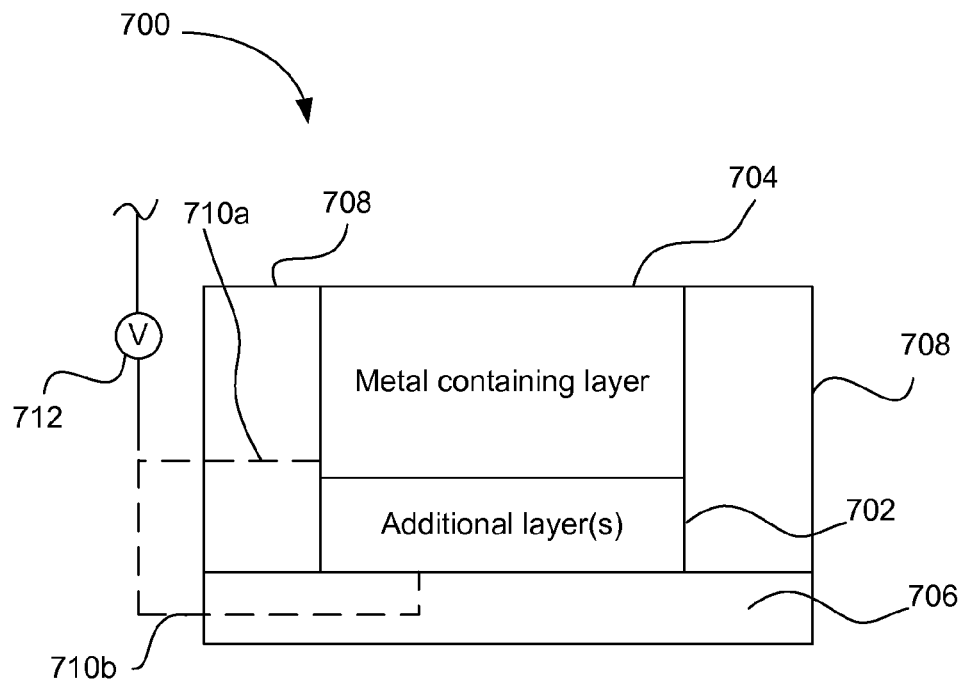
FIGS. 7A-7F illustrate the formation of a memory element as described in the process of FIG. 6.

In operation 602, lower level structures, for example signal lines such as signal lines 104 and 106 are formed. In operation 604, a metal containing layer is deposited over the lower level structures. The metal containing layer can be deposited using any appropriate technique, for example using PVD, ALD, CVD, or electroless deposition. FIG. 7A illustrates a memory element 700 that includes additional layers 702 (e.g. lower-level structures such as signal lines) and a metal containing layer 704 deposited over the additional layers 702.

The additional layers can be formed on a substrate 706, which can be a silicon substrate, glass, another insulating substrate, etc. The metal containing layer 704 can be, for example, a metal layer (e.g. metallic hafnium) or metal-containing layer (e.g. titanium nitride) deposited over an electrode. In some embodiments, for example, where the metal containing layer 704 is to be fully anodized, the additional layers 702 may include an electrode (e.g. the electrode 402) so that the metal containing layer 704 is formed on an electrode of the memory element. In other embodiments, for example, where the metal containing layer 704 is partially anodized, the unanodized portion of the metal containing layer can function as an electrode (e.g. the electrode 402). The metal containing layer 704 can be titanium nitride, hafnium, tantalum, zirconium etc. When a metal oxide and electrode are formed by partially oxidizing a metal containing layer, the electrode and metal oxide have a same metal (e.g. titanium oxide and a titanium nitride electrode).

The metal containing layer 704 may contain a metal that is the metal component of the desired metal oxide for the memory element 700. The metal containing layer 704 and additional layers 702 can, in some embodiments, be surrounded by optional insulating layers 708, which, for example, can be deposited after etching the metal containing layer 704 and/or the additional layers 702. The insulating layers 708 can be used to ensure that only the desired amount of the metal containing layer is anodized by allowing the electrolyte only to come into contact with the surface of the metal containing layer 704. In other embodiments, a blanket layer of the metal containing layer 704 can be anodized prior to etching to form individual memory elements, or the metal containing layer 704 can be deposited using a selective process, and the insulating layers 708 deposited afterward.

In operation 606, it is determined whether the metal containing layer 704 is to be fully anodizied. If the metal containing layer is to be full anodized (i.e. the entirety of the metal containing layer 704 is to be converted to metal oxide), the process 600 continues to operation 608 where the metal containing layer is full anodized. If, in operation 606, it is determined that the metal containing layer 704 is not to be fully anodized, the metal containing layer 704 is partially anodized in operation 610.

The memory element 700 can be oxidized by connecting one or more of leads 710a and 710b so that the metal containing layer is electrically connected to a power supply 712. The lead 710a is connected directly to the metal containing layer 704 and the lead 710b is connected to the additional layers 702, which may include electrical connections to the metal containing layer 704. The power supply 712 may be a single- or multi-channel potentiostat, for example.

Figure 7B:
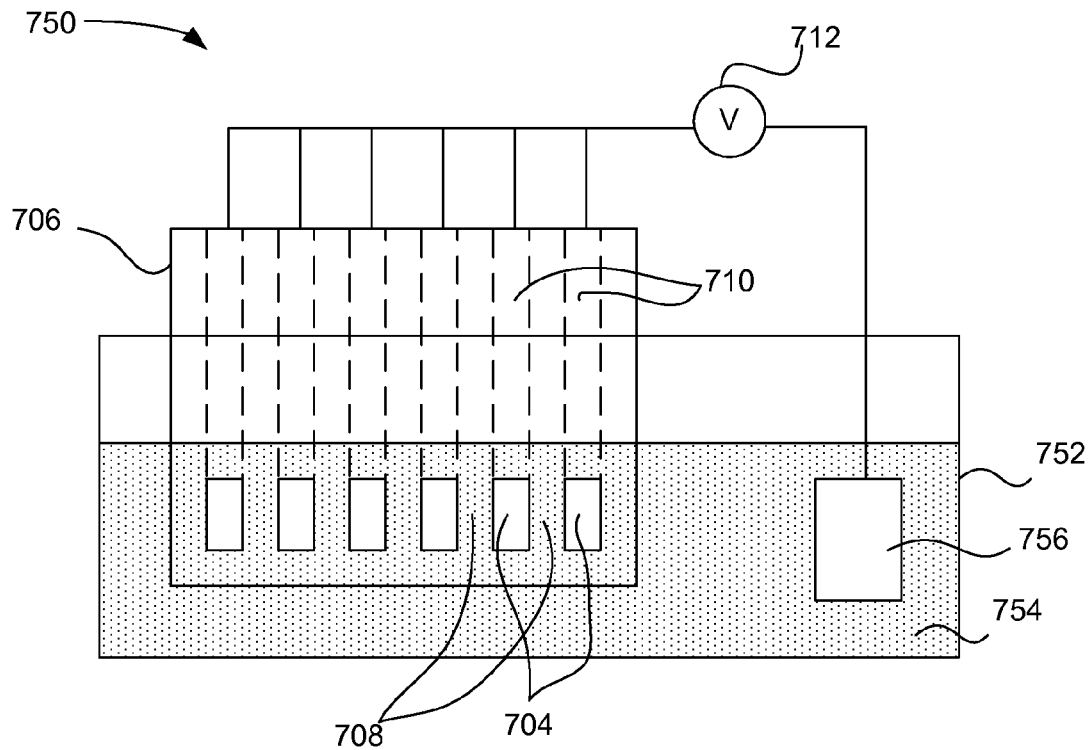

FIG. 7B illustrates a device 750 to perform anodization of a metal to form a resistive switching metal oxide. The metal containing layer 704 can be deposited or otherwise formed on the substrate 706. The leads 710 are embedded in or on top of the substrate 706, and may be insulated so that they do not become anodized. The view shown in FIG. 7B illustrates the metal containing layer 704 from above; the additional layers 702 are beneath the metal containing layer 704. In some embodiments, as shown in FIG. 7A, the insulating layers 708 adjacent to the metal containing layer 704 can allow the metal containing layer 704 to be partially anodized.

Figure 7C:
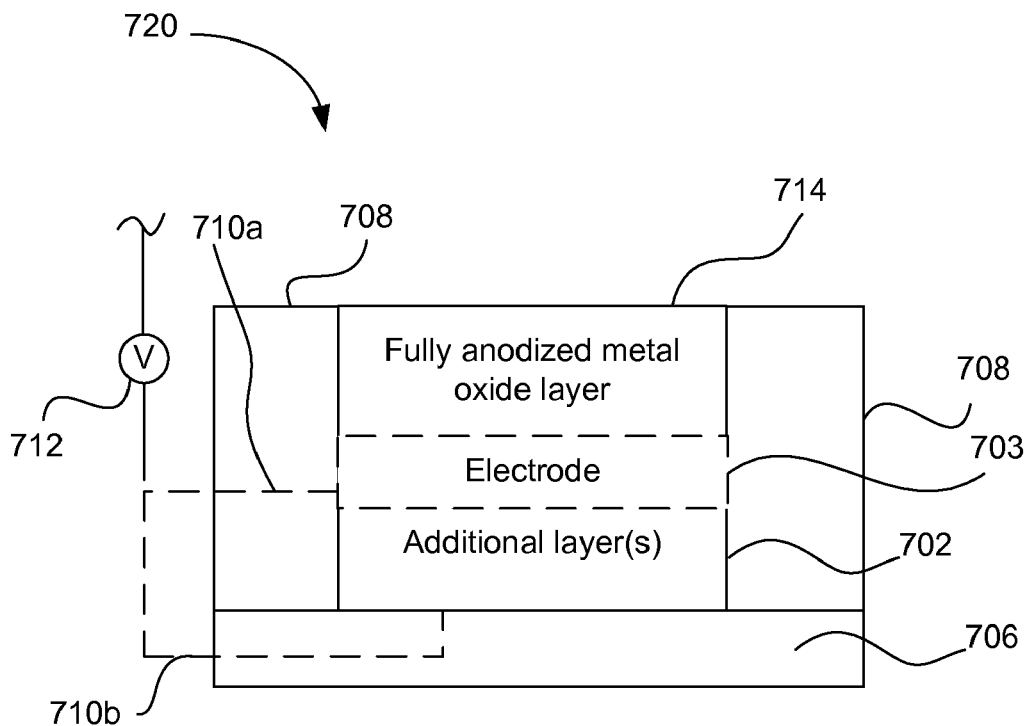

FIG. 7C illustrates a memory element 720 including a fully anodized metal oxide layer 714. For example, a titanium nitride metal containing layer 704 can be converted to a titanium oxide layer, or a hafnium metal layer can be converted to a hafnium oxide layer. As shown in FIG. 7C, when the entire memory element 720 is anodized, the additional layers 702 may include an electrode 703.

The anodization process can be performed using the device 750 shown in FIG. 7B. As shown in FIG. 7B, the substrate 706 is at least partially immersed into an electrolyte 754 in a container 752. The power supply 712 is connected to the conductive leads 710 and to a counter electrode 756. The power supply 712 can be a multi-channel potentiostat, for example, that is able to connect to multiple leads 710 (e.g. multiple metal-containing layers for multiple memory elements). The counter electrode 756 can be made of any appropriate material such as a conductive material that is inert in the used voltage range and electrolyte 754, and which will not contaminate the product of the electrochemical reaction on the opposite electrode (e.g. the metal containing layer 704) such as platinum mesh, copper, titanium nitride, titanium, stainless steel, etc.

The electrolyte 754 can be any solution appropriate for anodization, such as 0.01M-0.1M sulfuric acid. Other appropriate electrolytes include chromic, phosphoric, organic (e.g. oxalic, sulfosalicylic), etc. acids. The electrolyte 754 can also include other chemical agents.

The power supply 712 applies anodizing electrical conditions such as constant or pulsing voltage or current. Examples of anodization times include 1 second-240 seconds or longer, and examples of applied voltages include 0.5 V-30 V or greater. For example, samples can be anodized for 10, 30, 60, or 240 seconds at 30 V in 0.1 M sulfuric acid. After the anodization is complete, the substrate 706 can be removed from the electrolyte, and rinsed and dried as necessary.

The device 750 shown and the process described for forming memory elements are understood to be examples. Any device for anodizing metals can be used with the embodiments described herein.

Figure 7D:
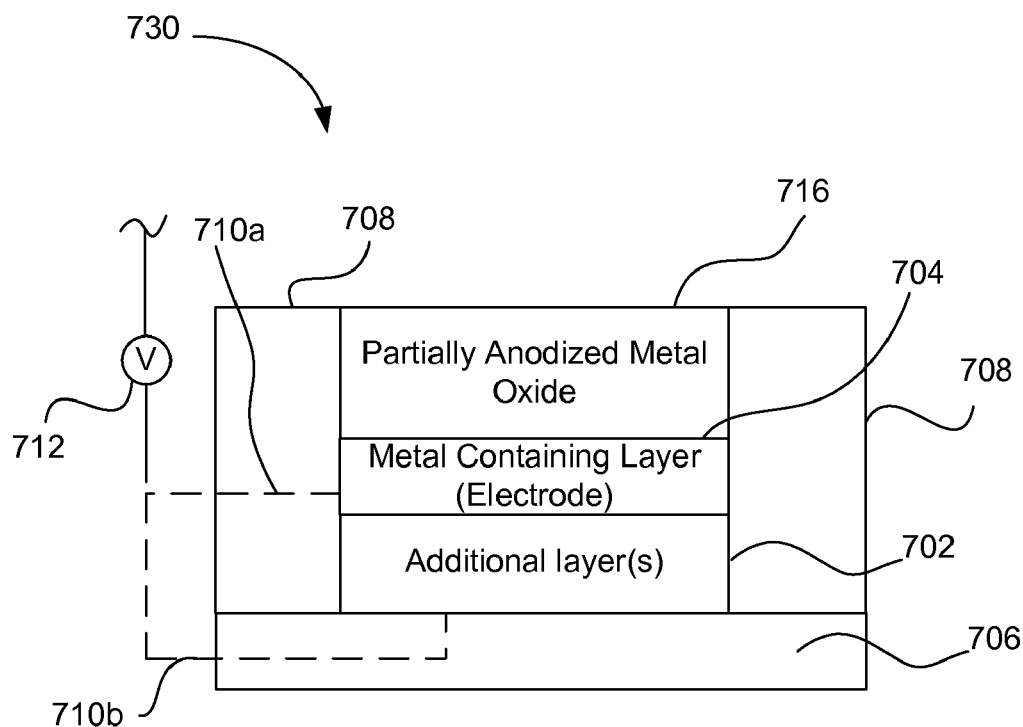

FIG. 7D illustrates a memory element 730 including a partially anodized metal oxide layer 716. The metal containing layer 704 can be partially anodized by applying the voltage for anodization for an appropriate amount of time. For example, at 15 V, a layer of metallic hafnium may anodize at 1 Å/s. A 150 Å layer of metallic hafnium could be oxidized for 60 seconds, which would result in a 60 Å hafnium oxide layer and a 90 Å metallic hafnium bottom electrode. Other material examples include a TiN metal containing layer that forms a titanium oxide resistive-switching layer. Since, in some embodiments, the metal containing layer 704 is surrounded by insulating layers 708 and only the surface of the metal containing layer 704 is exposed to the electrolyte 754, a portion of the thickness of the metal containing layer 704 can be anodized. This procedure can be used to form a metal oxide (e.g. the metal oxide 406) and an electrode (e.g. the electrode 402) of the memory element. In other embodiments, the additional layers 702 may also include an electrode as part of a bi-layer electrode.

Figure 7E:
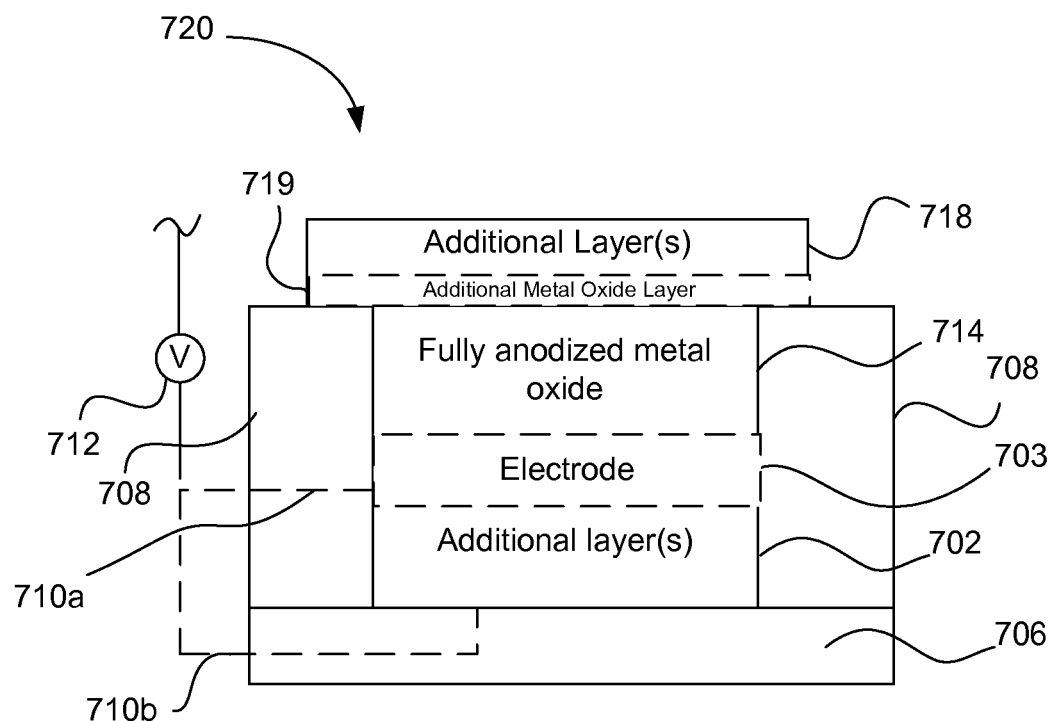
Figure 7F:
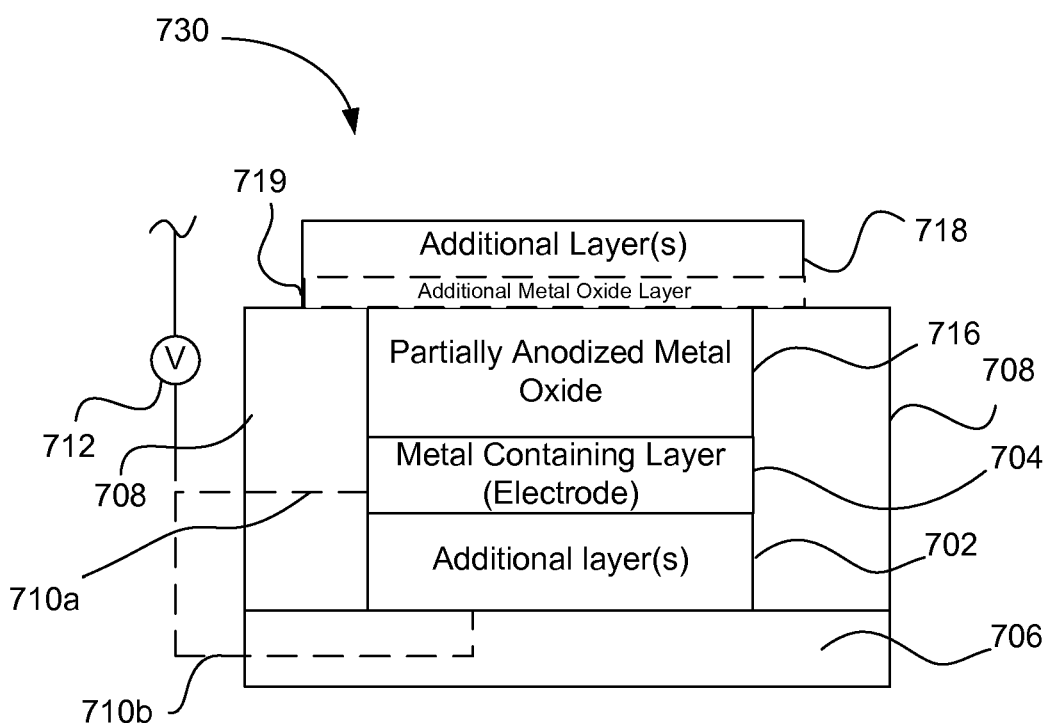

In operation 612, additional layers are deposited over the anodized metal oxide layer. Additional layers 718 of the memory element 720 are shown in FIG. 7E, and may include an electrode (e.g. the electrode 404) and/or additional layers. Additional layers 718 of the memory element 730 are shown in FIG. 7F, and may also include an electrode (e.g. the electrode 404) and/or additional layers. As discussed above the electrode can be a metal or metal oxide electrode, or can be a doped silicon (e.g. polysilicon) electrode. Additional layers 718 can also include other metal oxide layers, and can be formed using any other appropriate process including dry (e.g. PVD, ALD, CVD) and wet (e.g. ELD, ECD) processes.

The memory elements 700, 720, and 730 described herein can also include additional metal oxide layers 719, such as doping or diffusion barrier layers. For example, an additional metal oxide layer 719 can be deposited between the anodized metal oxide layer (e.g. the layers 714 or 716) and the additional layers 718 deposited on the anodized metal oxide layer (e.g. a top electrode). A diffusion barrier layer can be deposited in between the anodized metal oxide layer 716 or 718 and the top electrode to prevent diffusion between the top electrode and the anodized metal oxide layer 716 or 718 and to promote stability of the anodized metal oxide layer 716 or 718. The diffusion barrier layer can contain a same most prevalent metal as the adjacent electrode. For example, the anodized metal oxide layer 716 or 718 may be hafnium oxide, the diffusion barrier layer can be titanium oxide, and the electrode can be titanium nitride. In other embodiments, the additional metal oxides can be part of the additional layers 702.

The metal containing layer 704 can act as a seed layer for the anodization process. In some embodiments, multiple memory elements 102 are formed on a single substrate. The metal containing layer 704 can be a blanket seed layer deposited over a substrate. A portion of the metal containing layer 704 can be connected to a power supply to provide current for the anodization process. After anodization is complete, the anodized see layer can be patterned and etched to form individual memory elements.

Although certain operational mechanisms are described herein, it is understood that the various embodiments are not bound by the theories of these operational mechanisms. Further, although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a resistive-switching memory element comprising:
    forming a metal containing layer;
    anodizing the metal containing layer at least partially to form a resistive-switching metal oxide;
    forming a first electrode over the resistive switching metal oxide; and
    depositing another metal oxide layer between the resistive-switching metal oxide and the first electrode.

2. The method of claim 1, further comprising:
    forming the metal containing layer over a second electrode of the memory element.

3. The method of claim 1, wherein an unanodized portion of the metal containing layer comprises a second electrode of the memory element.

4. The method of claim 1, wherein the metal containing layer is fully anodized.

5. The method of claim 1, wherein the metal is chosen from the group consisting of hafnium, tantalum, and zirconium.

6. The method of claim 1, wherein the metal layer is deposited using a technique chosen from the group consisting of physical vapor deposition (PVD), atomic layer deposition (ALD), chemical vapor deposition (CVD), and electroless deposition (ELD).

7. The method of claim 1, wherein the resistive-switching metal oxide is formed without annealing.

* * * * *